United States Patent
Paul (10) Patent No.: US 9,841,478 B2
(45) Date of Patent: Dec. 12, 2017

(54) METHOD AND CONTROL DEVICE TO OPERATE A MAGNETIC RESONANCE SYSTEM

(71) Applicant: Siemens Aktiengesellschaft, Munich (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 474 days.

(21) Appl. No.: 14/582,324

(22) Filed: Dec. 24, 2014

(65) Prior Publication Data

US 2015/0185305 A1    Jul. 2, 2015

(30) Foreign Application Priority Data

Dec. 27, 2013  (DE) ........................ 10 2013 227 170

(51) Int. Cl.
| | |
|---|---|
| G01R 33/54 | (2006.01) |
| G01R 33/32 | (2006.01) |
| G01R 33/561 | (2006.01) |
| G01R 33/565 | (2006.01) |

(52) U.S. Cl.
CPC ............. *G01R 33/54* (2013.01); *G01R 33/32* (2013.01); *G01R 33/5617* (2013.01); *G01R 33/56518* (2013.01)

(58) Field of Classification Search
CPC ...... G01R 33/54; G01R 33/32; G01R 33/561; G01R 33/56518
See application file for complete search history.

(56) References Cited

U.S. PATENT DOCUMENTS

| | | | |
|---|---|---|---|
| 5,627,469 A | 5/1997 | Hong et al. | |
| 5,923,168 A * | 7/1999 | Zhou | G01R 33/56554 324/307 |
| 6,008,647 A * | 12/1999 | Zhou | G01R 33/56581 324/306 |
| 2008/0116891 A1* | 5/2008 | van der Kouwe | G01R 33/5616 324/312 |
| 2009/0230957 A1* | 9/2009 | Park | A61B 5/055 324/307 |
| 2012/0056620 A1* | 3/2012 | Feinberg | G01R 33/4835 324/309 |

OTHER PUBLICATIONS

"Variable Slew-Rate Spiral Design: Theory and Application to Peak B1 Amplitude Reduction in 2D RF Pulse Design," Xu et al., Magnetic Resonance in Medicine, vol. 58 (2007), pp. 835-842.

* cited by examiner

*Primary Examiner* — Rodney Bonnette
(74) *Attorney, Agent, or Firm* — Schiff Hardin LLP (57) ABSTRACT

In a method and a control device for operating a magnetic resonance system by a pulse sequence that includes an excitation phase, material in an examination volume is excited by emission of an RF excitation pulse during a selection gradient pulse in a first gradient direction. RF refocusing pulses are then emitted and readout gradient pulses are activated in a second gradient direction for spatially coded acquisition of raw data of the examination volume along the second gradient direction. A prephasing gradient pulse is switched before a first RF refocusing pulse in the second gradient direction, and/or a rephaser gradient pulse is switched before an RF restore pulse, following the RF refocusing pulses, in the second gradient direction. The prephaser gradient pulse and/or the rephaser gradient pulse have lower slew rates than the readout gradient pulses.

14 Claims, 7 Drawing Sheets

METHOD AND CONTROL DEVICE TO OPERATE A MAGNETIC RESONANCE SYSTEM

BACKGROUND OF THE INVENTION

Field of the Invention

The invention concerns a method and a control device to operate a magnetic resonance system to emit or activate a pulse sequence. The invention also concerns a magnetic resonance tomography system (also shortened to magnetic resonance system or "MRT").

Description of the Prior Art

Magnetic resonance tomography is by now a widespread technique for the acquisition of images of the inside of a living examination subject.

Atomic nuclei, of hydrogen atoms, for example, have a spin. The spin is a quantum mechanical property of atomic particles. The spin has the effect that the atomic particles are magnetic, meaning that an atomic nucleus with spin is a dipole. These spins initially act in any direction, and can be considered as a vector. Atoms with spin are present in a body to be examined, for example a human body.

In a magnetic resonance tomography system, the body to be examined is typically exposed to a relatively high basic magnetic field $B_0$, for example of 1, 5, 3 or 7 Tesla, with the use of a basic field magnet system. The static magnetic field $B_0$ imposes a preferential direction of the spins parallel and antiparallel to the field lines. An excess always forms in one direction, which leads to a macroscopic magnetization of the spin ensemble.

A radio-frequency field $B_1$ is superimposed on the static magnetic field $B_0$. This radio-frequency field normally generated by radio-frequency excitation pulses, deflects the spins out of the steady state generated by the $B_0$ field when the radio-frequency excitation signals are in resonance with the precession frequency of the spins. The precession frequency is also called Larmor frequency and is dependent on the strength of the $B_0$ magnetic field. The radio-frequency excitation signals excite the nuclear spins of the atoms to resonance by being flipped (deflected) by a defined flip angle relative to the magnetic field lines of the basic magnetic field.

The connection between a resonant radiated RF pulse with the field strength $B_1$ and the flip angle $\alpha$ that is achieved with this is provided by the equation $$\alpha = \int_{t=0}^{\tau} \gamma \cdot B_1(t) \cdot dt \quad (1)$$

wherein $\gamma$ is the gyromagnetic ratio (which is fixed material constant for most nuclear spin examinations) and $\tau$ is the duration of action of the radio-frequency pulse.

The emission of the radio-frequency signals for nuclear spin magnetization most often takes place from a "whole-body coil" or "body coil". A typical design of a whole-body coil is a cage antenna (birdcage antenna), composed of multiple transmission rods that—proceeding parallel to the longitudinal axis—are arranged around a patient space of the MRT in which a patient is located in the examination. The antenna rods are respectively connected capacitively with one another in a ring on their front sides. However, by now body-proximal local coils are also increasingly used for the emission of MRT excitation signals. The reception of the magnetic resonance signals normally takes place with the local coils, but in some cases alternatively or additionally with the body coil. Magnetic resonance images of the examination subject are created on the basis of the received magnetic resonance signals. Each image point in the magnetic resonance image is associated with a small body volume (what is known as a "voxel"), and each brightness value or intensity value of the image points is linked with the signal amplitude of the magnetic resonance signal that is received from this voxel.

The signals emitted upon the precession and received by the reception antennas must be spatially associable in order to enable an imaging. For this purpose, in the acquisition of the signals a spatial coding is implemented by coding gradients.

For this purpose, a gradient along a gradient direction (x, y, z) is applied by gradient coils. The magnetic field $B_0$ thereby increases linearly in the direction of the superimposed gradient. The precession of the nuclear spins is accordingly different along the gradient direction, spinning slower at some points and faster at others. They therefore show resonance at different frequencies. A spatially selective excitation of the nuclear spins is possible by the superimposed gradient field.

The control of the magnetic resonance system for acquisition of the raw data takes place according to a "pulse sequence". A "pulse sequence" (also shortened to just "sequence") is a combination of radio-frequency pulses $B_1$ and magnetic gradient fields $B_{grad}$ of defined frequency or strength, which are switched on and off multiple times in a predetermined order every second.

In many sequences, a radio-frequency pulse $B_1$ of suitable frequency (Larmor frequency), known as the 90° excitation pulse, is present at the beginning. By this pulse, the magnetization of the spins is deflected by 90° transverse to the external magnetic field $B_0$, so these nuclei begin to spin around the original axis. As in the case for a top that is jolted, this movement is called precession.

The radio-frequency signal that thereby arises can be measured outside of the body. It decreases exponentially because the proton spins get out of "time" ("dephase") and increasingly destructively superimpose. This depends on the chemical environment of the hydrogen and is different for every type of tissue.

By radiating a suitable 180° rephasing radio-frequency pulse, the effect can be produced that a portion of the dephasing is canceled again at the point in time of the measurement, so that more spins are again in the same phase.

In order to be able to associate individual volume elements (voxels) with the signals, a spatial coding is generated with linearly spatially dependent magnetic fields (gradient fields). Use is made of the fact that the Larmor frequency for a specific particle is dependent on the magnetic flux density (the stronger the field portion orthogonal to the direction of the particle's angular momentum, the higher the Larmor frequency).

This can proceed as follows for a typical 2D magnetic resonance pulse sequence:

A first gradient (in the z-direction, for example) is present at the excitation and ensures that only a single slice of the body possesses the matching Larmor frequency, thus that only the spins of this slice are deflected (slice selection gradient).

A second gradient (in the x-direction, for example) is switched at right angles to the two others during the measurement and ensures that the spins of each image column have a different precession velocity, thus emit a different Larmor frequency (readout gradient, frequency coding gradient).

A third gradient (in the y-direction, for example) transversal to the two others is activated briefly after the excitation and produces a controlled dephasing of the spins such that the precession of the spins has a different phase position in each image line (phase coding gradient).

All three gradients z, x, y together thus produce here a coding of the signal in three spatial planes. The received signal belongs to a defined slice of the body and includes a combination of frequency coding and phase coding.

As described above, in 2D magnetic resonance pulse sequences a spatial coding takes place in two directions or dimensions. Therefore, respective image information or raw data is read out for a very thin slice. The slice is selected in advance.

In 3D magnetic resonance pulse sequences, the spatial coding takes place in three directions or dimensions. Therefore, image information or raw data are read out for an entire volume, known as a "slab". During the subsequent acquisition of the raw data from the excited slab, usually the readout takes place with frequency coding in one direction and a phase coding taking place in the other two directions.

The raw data are entered into a memory at data points organized as a matrix, known as k-space. The values in k-space are mathematically in frequency domain that is related to a partial domain that includes the subject magnetization, by a Fourier-conjugate, which means that the data in the frequency domain are converted into the data in the spatial domain by a Fourier transformation. The axes of k-space designate spatial frequencies. k-space has a unit that is inverse to the distance, for example 1/cm. In 3D tomography, k-space is also three-dimensional. A two-dimensional image or a three-dimensional image volume is then reconstructed with a (two- or three-dimensional) Fourier transformation from the raw data in two-dimensional or three-dimensional k-space.

Static magnetic field differences contribute to an expansion of the spins upon relaxation. With spin echo sequences, this expansion is canceled by a refocusing pulse or, respectively, by a series of refocusing pulses. If multiple refocusing pulses (normally 180° pulses) follow in succession, multiple spin echoes arise, generated by one multiecho sequence. The writing into k-space depends on, among other things, the desired contrast. The earlier echoes—meaning the echoes with a smaller position number—are often initially written into central k-space.

SPACE (Sampling Perfection with Application optimized Contrast using different flip angle Evolutions) is one example of a three-dimensional turbo spin echo sequence method (more precisely a single slab 3D turbo spin echo method) that can have very long echo trains. For example, a long echo train includes between forty and multiple hundreds of echoes; even a thousand echoes are possible, for instance. For a "provided signal development" (prescribed signal evolution), the flip angle of the refocusing pulses in an echo train is adapted to the properties (T1 and T2) of the different tissue types. A variable flip angle curve (flip angle evolution) is obtained. A desired signal strength is generated for different types of tissue. For example, a desired contrast can therefore be generated.

The exciting radio-frequency signal or the exciting radio-frequency pulse receives a defined bandwidth of neighboring frequencies around a center frequency. In this way, a desired region along the gradient direction can be excited.

In nearly all molecules, multiple hydrogen atoms are bound at different positions. Different positions mean different chemical (and therefore for the most part also different magnetic) environments. The local magnetic field gradient is hereby reduced or, respectively, increased; the resonance frequencies of the bound protons are somewhat lower or higher than the typical Larmor frequency.

The nuclear spins in the body tissue thus have no uniform precession frequency in the magnetic field, but rather differ according to their chemical environment for different tissue types. This is typically designated as a chemical shift. Fat has multiple peaks in the spectrum, but one is more strongly pronounced and delivers a high signal to the imaging. The chemical shift between the main peak of adipose tissue and water is approximately 3.5 ppm, for example.

Herein, the signal that a nuclear spin that is present in fat tissue emits upon relaxation is designated as a "fat signal". The signal that a nuclear spin that is located in an aqueous region emits upon relaxation is designated as an "aqueous signal" ("water signal").

In many cases in the diagnosis of possible pathologies, it is problematic that the very bright fat signal outshines the aqueous signal that is of primary interest.

Therefore, possibilities have already been proposed to suppress the fat signal. For example, before the actual measurement a frequency-selective pulse is emitted at the precession frequency of the protons situated in the adipose tissue, such that their spins are saturated and no longer contribute to the signal in the subsequent image acquisition.

Due to eddy current effects and due to a limited bandwidth of the RF pulses of the $B_1$ field (due to limited $B_1$ peak, SAR etc.), a signal shadowing in the generated MRT images (for example in adipose tissue) can occur which can reduce the diagnostic value of the MRT images.

Eddy currents of an emitted or switched (activated) gradient widen the frequency distribution (spectrum) of the tissue within the region to be examined (FOV=field of view). This tissue is often a mixture of fat and water and, due to the chemical shift, as explained above there is a spacing between fat and water. This spacing becomes even wider due to the additional magnetic field (during the RF pulse) of the eddy currents. If the bandwidth of the RF pulses is limited, the entire spectrum cannot be refocused or, respectively, excited by the RF pulses. This problem of too little bandwidth in particular relates to the refocusing pulses, which normally are not spatially selective.

In more recent MRT systems, the available $B_1$ peak of the RF pulses is reduced, such that this problem increasingly comes to the fore. This problem occurs less in a system with a $B_1$ value of the RF pulses of 17 µT, but it occurs to an increased degree in a system with a $B_1$ value of the RF pulses of 14 µT.

SUMMARY OF THE INVENTION

An object of the present invention to provide a method that is usable in three-dimensional magnetic resonance tomography and a corresponding control device to control a magnetic resonance system, with which method and control device unwanted signal shadows in the generated MRT images due to eddy current effects of the $B_1$ field of the RF pulses can be avoided, or at least reduced.

The method according to the invention includes an excitation phase and an acquisition phase.

In the excitation phase, as is typical material in an examination volume is spatially selectively excited via emission of an RF excitation pulse, preferably with application of a selection gradient pulse in a first gradient direction, for example the spatial selection direction or, respectively, slice selection direction z.

Insofar as the preferred selective excitation takes place, the gradient applied in a gradient direction has the effect (in the known manner) that the Larmor frequency of the nuclear spins changes along the gradient. The output, selective radio-frequency excitation pulse will therefore excite only nuclear spins in a certain region, and in fact in the region in which the nuclear spins (i.e. their Larmor frequency) are in resonance with the frequency of the excitation pulse. The bandwidth of the excitation pulse thereby determines the thickness of the excited region.

Due to the chemical shift between the first and second material—in particular the chemical shift between water and fat—regions for water and for fat that are shifted somewhat counter to one another are excited. In the acquisition phase, a spatial coding is implemented along different gradient directions. The partial region in which the material is excited is thus acquired with spatial coding. An acquisition of raw data occurs in the acquisition phase. An image acquisition takes place in post-processing without separation of water signal and fat signal.

A certain selection of the bandwidth of the excitation pulse preferably takes place for this. The bandwidth can thereby be adapted to the gradients. Narrowband pulses are normally selected for this. For example, given a bandwidth of an excited RF pulse of 1 kHz, the fat signal is shifted by approximately 0.63 mm relative to the water signal given a field strength of 1.5 Tesla. At 3 Tesla, this shift is doubled relative to a 1.5 Tesla magnetic field, meaning that it then amounts to 1.26 mm. At 7 Tesla, the spacing already amounts to 2.98 mm. This shift can intensify further due to eddy currents which are caused by gradient pulses, which can lead to the situation that the bandwidth of subsequent refocusing pulses is no longer sufficient to simultaneously refocus water and fat.

In the subsequent acquisition phase, a number of refocusing pulses (i.e. at least one, but preferably more) are output in order to acquire raw data of the examination volume with spatial coding along the desired gradient direction. Refocusing pulses can generally be selective or non-selective.

According to the invention, in the acquisition phase a number of RF refocusing pulses are emitted and a number of readout gradient pulses are activated in a second gradient direction (for example the x-gradient direction or the y-gradient direction) for spatially coded acquisition of raw data of the examination volume along the second gradient direction x or y. A prephasing gradient pulse (also called a readout prephaser gradient pulse) is switched before a (preferably the) RF refocusing pulse (associated with a first readout process) in the second gradient direction x or y, and/or a rephaser gradient pulse is switched before an RF restore pulse (following the number of RF refocusing pulses) in the second gradient direction x or y. The prephaser gradient pulse and/or the rephaser gradient pulse has lower edge steepnesses (at least one of the two edges)—also called slew rate(s)—than the number of readout gradient pulses, and/or a wait time interval is inserted between the prephaser gradient pulse and the refocusing pulse and/or between the rephaser gradient pulse and the RF restore pulse.

As used herein the "RF refocusing pulse associated with a first readout process" is hereby the refocusing pulse that leads to an echo to be read out, which is read out in a subsequent first readout process (for example by placing a suitable readout window) for raw data acquisition in order to then be used for the later image data reconstruction in a known manner, for example. This RF refocusing pulse associated with the first readout process is also designated in shortened form in the following as a "first RF refocusing pulse", even if it is not thereby precluded that additional RF refocusing pulses are still placed in advance. The solution is based primarily on two gradients.

1. the readout prephaser gradient (prephaser) before the first refocusing pulse;
2. the rephasing gradient (rephaser) before the restore pulse.

Regarding 1.: Readout Prephaser Gradient (Prephaser)

A reduced execution of the readout prephaser gradient (prephaser) in contrast to all other gradients—in particular all other readout gradients—in the sequence helps to reduce the eddy currents, and therefore to improve the image quality. This readout prephaser gradient (prephaser) can be temporally extended since the chronological workflow of the excitation block is independent of the chronological workflow during the output of the echo train and the (raw) data acquisition. During this wait time, eddy currents can decay; they therefore do not expand the spectrum.

This wait time should preferably also be added after the refocusing pulse in order to comply with the chronological workflow, wherein the time for the echo time delay (ESP=echo spacing) is the same on both sides.

Regarding 2.: Rephasing Gradient (Rephaser)

While the echo spacing ESP at selective locations is not a limiting factor for the readout prephaser gradient (prephaser), this is however the case for the rephasing gradient (rephaser). A lengthening of this pulse would likewise lengthen the echo spacing ESP during the complete echo train, and therefore reduce the efficiency of the sequence.

In order to now be able to use a longer gradient, an additional refocusing pulse is inserted after the last readout pulse.

The additional refocusing pulse generates an echo with a longer time gap before the restore pulse. Due to the extended echo spacing, a gradient with reduced execution can be used in order to reduce eddy current artifacts. In addition to this, a wait time can also be inserted before and after the additional refocusing pulse, which enables the eddy currents to further decay.

The method according to the invention is based primarily on the following features:

1. Insertion of wait times after special readout gradients in order to reduce eddy current effects.
2. Explicit reduction of the execution (in particular the slew rates) of certain readout gradients in order to reduce eddy current effects.
3. Insertion of an additional refocusing pulse before the restore pulse, or chronologically shifting the last refocusing pulse before the restore pulse backwards, in order to decouple the chronological workflow between the echo train and the storage or, respectively, restore of the raw data.

The advantage of the method according to the invention is an improved image quality due to reduced eddy current effects, without affecting the chronological workflow of the sequencing.

The method according to the invention can in principle be applied for any materials that in particular exhibit a chemical shift relative to one another, for example given measurements of specific metabolites. However, the main problem in most clinical examinations is the high signal of the fat portion relative to the typically excited water, such that the method is preferably applied for water and fat.

Furthermore, the present invention also protects a control device for controlling a magnetic resonance system that comprises an RF transmission antenna system, a gradient system and an RF reception antenna system. The control device is designed so that it preferably controls the gradient system in order to apply a first gradient along the first gradient direction (for example the z-direction) to generate a spatially dependent magnetic field. Furthermore, the control device is designed so that it controls the RF transmission antenna system in order to output a (preferably selective) radio-frequency excitation pulse that excites a material in an examination volume. Furthermore, the control device is designed so that it controls the RF transmission antenna system in order to output a number of refocusing pulses, and controls the gradient system in order to output a number of readout gradient pulses in a second gradient direction for spatially coded acquisition of raw data of the examination volume along the second gradient direction (for example the x-direction or y-direction).

The control device is designed so that a prephaser gradient pulse is switched before a (preferably the) RF refocusing pulse (associated with a first readout process) in the second gradient direction, and/or a rephaser gradient pulse is switched before an RF restore pulse (following the number of RF refocusing pulses) in the second gradient direction.

The control device thereby ensures that the prephaser gradient pulse and/or the rephaser gradient pulse has lower slew rates than the number of readout gradient pulses.

As an alternative or in addition to the lower slew rates, the control device ensures that a wait time interval is inserted between the prephaser gradient pulse and the refocusing pulse (which is preferably associated with the first readout process) and/or between the rephaser gradient pulse and the RF restore pulse.

Furthermore, a magnetic resonance tomography system (MRT) with a control device as described in the preceding is protected within the scope of the present invention.

A majority of the aforementioned components of the control device can be realized wholly or in part in the form of software modules in a processor of a corresponding control device. This is inasmuch advantageous since, via a software installation, control devices that already exist can be retrofitted to implement the method according to the invention. The invention therefore also includes a non-transitory, computer-readable data storage medium that can be loaded directly into a processor of a programmable control device of a magnetic resonance tomography system, encoded with program code in order to cause the control device to execute all steps of the method according to the invention when the program is executed in the control device.

In an embodiment of the method according to the invention, the rephaser gradient pulse is radiated (emitted) with flatter slew rates at the beginning and/or at the end of the rephaser gradient pulse, in contrast to at least the majority (preferably to all) of the other gradient pulses in the gradient pulse sequence.

In a further version of this feature, the rephaser gradient pulse is radiated with lower amplitude (voltage $U(B_{grad})$) and/or reduced pulse duration in contrast to the majority of other (preferably all other) gradient pulses in the gradient pulse sequence.

In another version of this feature, in contrast to all (or at least the majority) of other gradient pulses in the gradient pulse sequence, the rephaser gradient pulse is emitted modified relative to a conventional, unmodified sequence such that the gradient moment ($\int i(t) \cdot dt$)—i.e. the area of the pulse over/under the time axis—remains approximately the same.

In a further embodiment of the method according to the invention, the slew rates of the prephaser gradient pulse or of the rephaser gradient pulse are greater than or equal to 20 mT/(m·ms) and preferably are smaller than or equal to 120 mT/(m·ms), particularly preferably are smaller than or equal to 100 mT/(m·ms), especially preferably are smaller than or equal to 80 mT/(m·ms).

In a further embodiment of the method according to the invention, the wait time interval lies between the prephaser gradient pulse and the first refocusing pulse and/or between the rephaser gradient pulse and the RF restore pulse, in a range of greater than or equal to 1 ms and less than or equal to 20 ms.

In a further embodiment of the method according to the invention, an additional refocusing pulse is emitted before the RF restore pulse and/or the last refocusing pulse of the originally provided gradient pulse sequence is emitted chronologically later by one pulse, such that the time for the echo spacing 1 between the echoes is replaced by a time extended by one pulse as echo spacing 2.

The invention can be used in different sequences or sequence types in which refocusing pulses are used. These are a (particularly preferably three-dimensional) spin echo sequence or turbo spin echo sequence.

DESCRIPTION OF THE PREFERRED EMBODIMENTS

In the following, the invention will be described with reference to a 3D magnetic resonance pulse sequence since its application herein is particularly advantageous.

Figure 1:
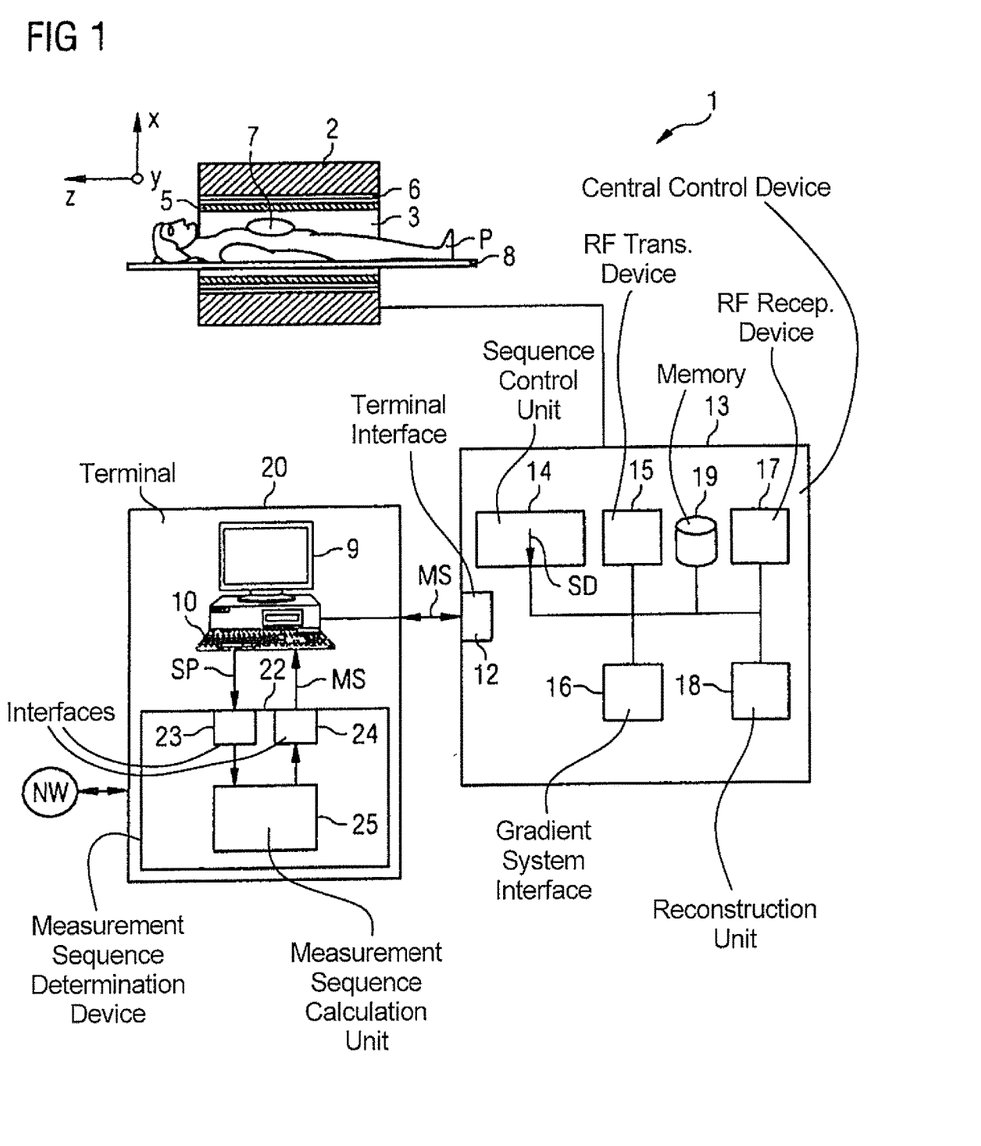
FIG. 1 is a schematic representation of a magnetic resonance system according to one exemplary embodiment of the invention.

A magnetic resonance tomography system 1 (shortened in the following to "magnetic resonance system") is shown schematically in FIG. 1. Normally both two-dimensional and three-dimensional raw data acquisitions can be conducted with a magnetic resonance system as shown in FIG. 1. The magnetic resonance system 1 comprises on the one hand the actual magnetic resonance scanner 2 with an examination space 3 or, respectively, patient tunnel into which can be driven (on a bed 8) an examination subject P (or, respectively, here a patient or test subject) in whose body is located the examination subject, for example a specific organ.

The magnetic resonance scanner 2 is typically equipped with a basic field magnet system, a gradient system 6 and an RF transmission antenna system 5 and an RF reception antenna system 7. In the shown exemplary embodiment, the RF transmission antenna system 5 is a whole-body coil permanently installed in the magnetic resonance scanner 2, in contrast to which the RF reception antenna system 7 is comprised of local coils to be arranged on the patient or, respectively, test subject (symbolized in FIG. 2 by only a single local coil). In principle, however, the whole-body coil can also be used as an RF reception antenna system and the local coils can be used as an RF transmission antenna system insofar as these coils can respectively be switched into different operating modes. The basic field magnet system is typically designed so that it generates a basic magnetic field in the longitudinal direction of the patient, i.e. along the longitudinal axis of the magnetic resonance scanner 2 that travels in the z-direction. The gradient system 6 typically comprises individually controllable gradient coils in order to be able to switch gradients independently of one another in the x-, y- or z-direction.

The magnetic resonance system shown in FIG. 1 is a whole-body system with a patient tunnel into which a patient can be completely introduced. In principle, however, the invention can also be used at other magnetic resonance systems, for example with laterally open C-shaped housing, but in particular also with smaller magnetic resonance scanners into which only one body part can be positioned, for example.

Furthermore, the magnetic resonance system 1 has a central control device 13 that is used to control said magnetic resonance system 1. This central control device 13 comprises a sequence control unit 14 for measurement sequence control. With this, the order of radio-frequency excitation pulses (RF pulses) and gradient pulses is controlled. The design of the control device—normally the design of a computer program product that runs in the control device—decides the type of the image acquisition.

To emit the individual RF pulses, the central control device 13 has a radio-frequency transmission device 15 that generates the excitation pulses, amplifies them and feeds them via a suitable interface (not shown in detail) into the RF transmission antenna system 5. To control the gradient coils of the gradient system 6, the control device 13 has a gradient system interface 16. The sequence control unit 14 communicates with the radio-frequency transmission device 15 and the gradient system interface 16 in a suitable manner, for example via emission of sequence control data SD. The control device 13 moreover has a radio-frequency reception device 17 (likewise communicating in a suitable manner with the sequence control unit 14) in order to acquire magnetic resonance signals (i.e. raw data) received by the RF reception antenna system 7.

A reconstruction unit 18 accepts the acquired raw data and reconstructs magnetic resonance image data from these. These image data can then be stored in a memory 19, for example.

Operation of the central control device 13 takes place via a terminal with an input unit 10 and a display unit 9, via which the entire magnetic resonance system 1 can thus also be operated by an operator. MR images can also be displayed at the display unit 9, and measurements can be planned and started by means of the input unit 10, possibly in combination with the display unit 9.

The magnetic resonance system 1, and in particular the control device 13, can have additional components that are not shown here in detail but that are typical of such systems, for example a network interface in order to connect the entire system with a network and to be able to exchange raw data and/or image data or, respectively, parameter maps, but also additional data such as (for example) patient-relevant data or control protocols.

The manner which suitable raw data can be acquired by a radiation of RF pulses and the generation of gradient fields, and how MR images can be reconstructed therefrom, are well known to those skilled in the art and thus need not be explained in detail herein.

In order to start a measurement, an operator can typically select via the terminal from a memory 19 (in which are stored a plurality of control protocols for different measurements) a control protocol provided for this measurement. Among other things, this control protocol includes different control parameters SP for the respective measurement. Numbering among these control parameters SP are defined basic specifications for the desired measurement sequence, for example whether it is s spin echo sequence, a turbo spin echo sequence etc. Additionally numbering among these are control parameters with regard to the magnetizations to be achieved via the individual radio-frequency pulses, specifications about a k-space gradient trajectory to be traversed to acquire raw data, and moreover slice thicknesses, slice intervals, number of slices etc.

Moreover, the operator can also retrieve control protocols via a network NW—for example from a manufacturer of the magnetic resonance system—and then modify these as necessary and use them.

Based on the control parameters SP, a measurement sequence MS is then determined with which the actual control of the remaining components ultimately takes place via the measurement control unit 14.

This measurement sequence MS is calculated in a measurement sequence determination device 22, which here is depicted as part of the terminal 20 and (for example) can be realized in the form of software components on the computer of this terminal 20. In principle, however, the measurement sequence determination device 22 can also be part of the control device 13 itself, in particular of the measurement control unit 14. However, the measurement sequence determination device can also be realized at a separate computer system which, for example, is connected via the network NW with the magnetic resonance system.

This measurement sequence determination device comprises on the one hand an input interface 23 to accept the control parameters SP.

These control parameters SP are then passed to a measurement sequence calculation unit 25 that determines an optimal measurement sequence in the manner according to the invention. These can then be output again via a measurement sequence interface 24 and—for example in the case shown in FIG. 1—can be passed via the terminal interface 12 to the measurement control unit 14, such that then the measurement runs wholly automatically. Typically, not only one measurement sequence but rather a series of such measurement sequences is generated for a measurement, which series of such measurement sequences is then executed in succession in order to acquire the required raw data RD for the desired image data BD.

Figure 2:
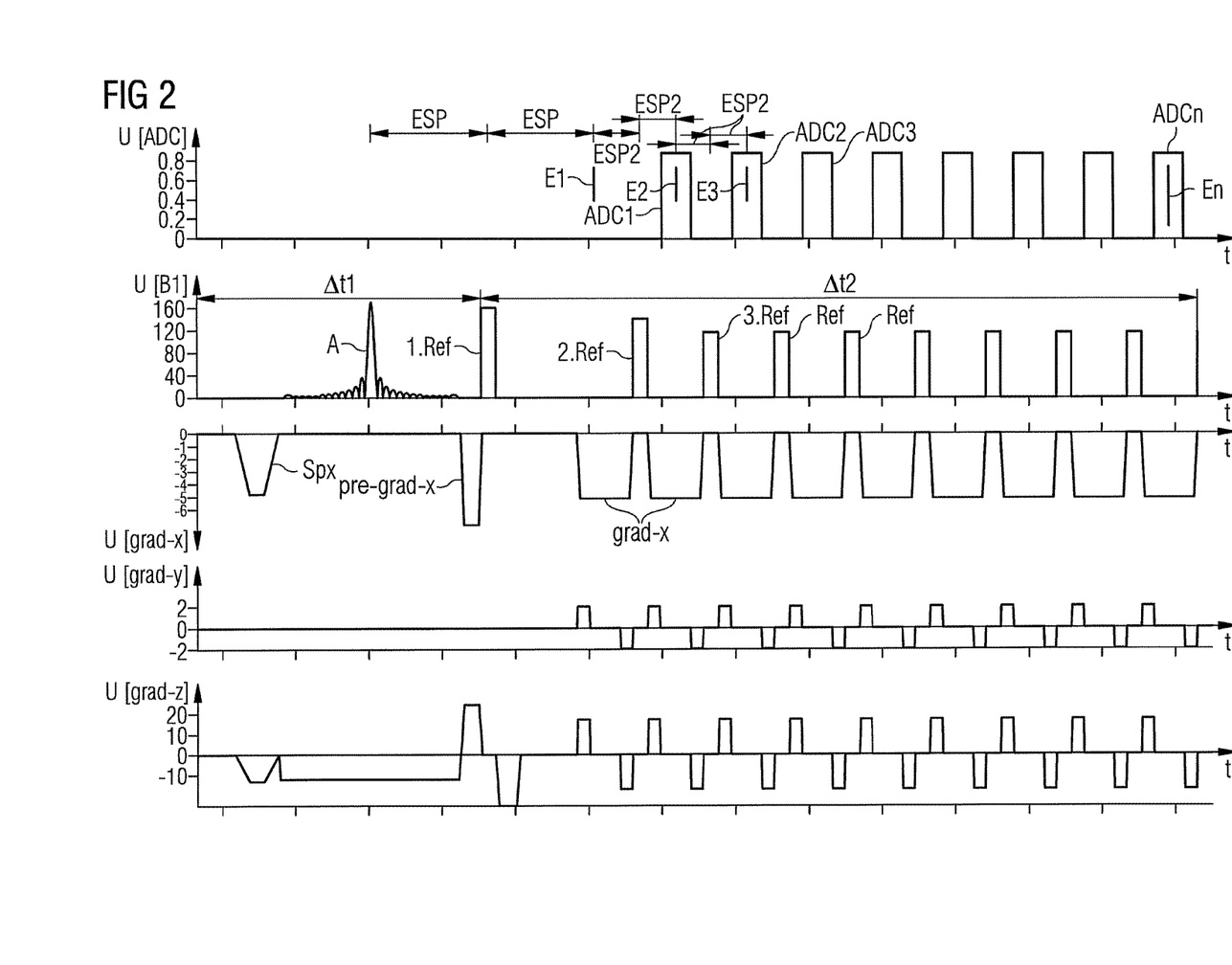
FIG. 2 is a diagram of a start of an echo train of a pulse sequence in which the RF excitation pulse sequence and the pulse sequences of all gradients x, y, z as well as the readout pulses are shown.

FIG. 2 shows a diagram of a start of an echo train of a pulse sequence at which the invention can be used, in which the RF excitation pulse sequence and the pulse sequences of all gradients x, y, z as well as the readout pulses are shown.

Figure 3:
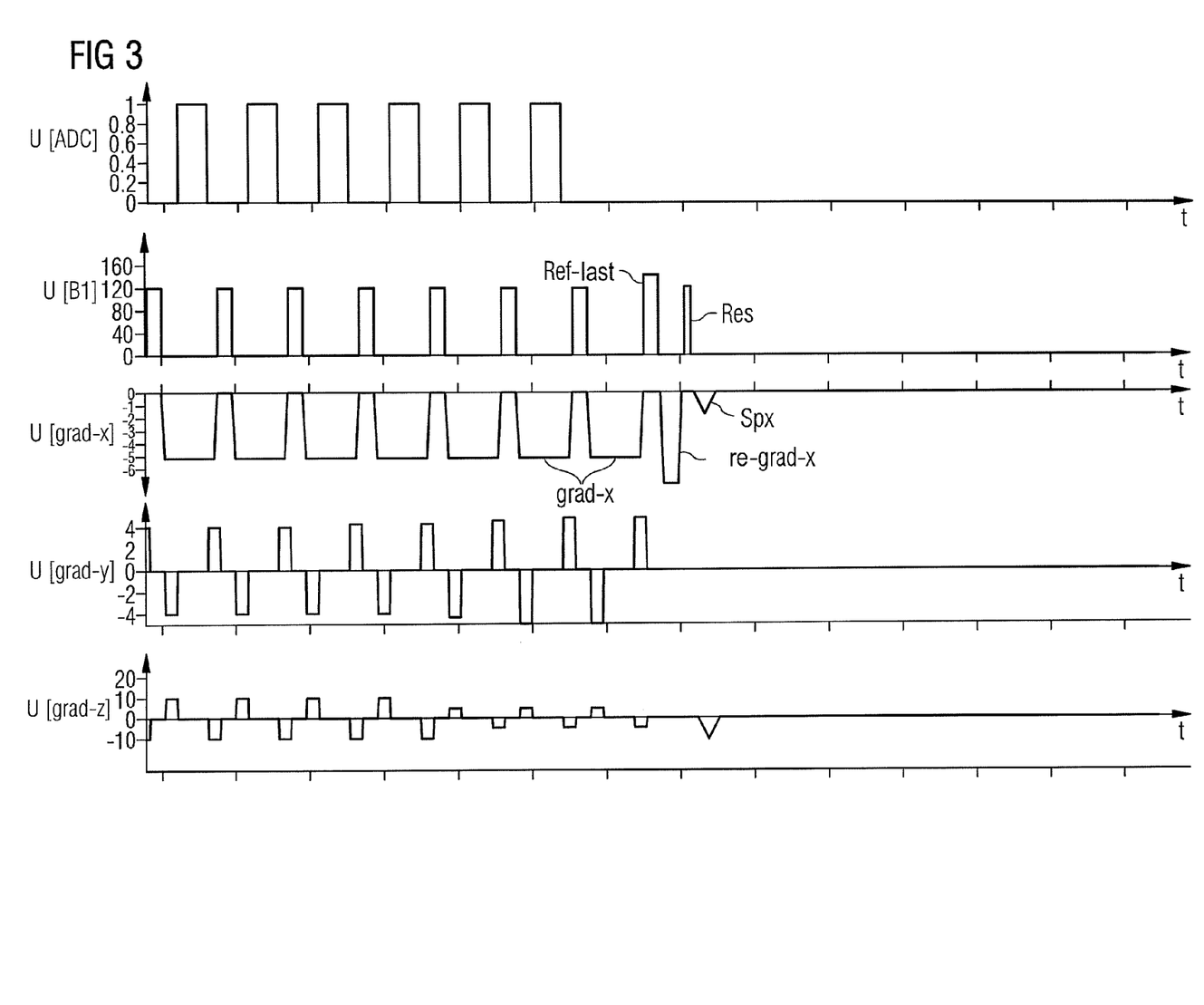
FIG. 3 is a diagram of an end of an echo train of a pulse sequence in which the RF excitation pulse sequence and the pulse sequences of all gradients x, y, z as well as the readout pulses are shown.

FIG. 3 shows a diagram of an end of the echo train of such a pulse sequence in which the RF excitation pulse sequence and the pulse sequences of all gradients x, y, z as well as the readout pulses are shown.

The voltages U(ADC) of the readout pulses of the A/D converter for the reception antennas (for example the local coils) and the voltages U(B1) of the RF excitation pulse sequence of the B1 field as well as the voltages of all gradients x, y, z—namely U(grad-x), U(grad-y), U(grad-z)—are respectively shown in the sequence diagrams of FIGS. 2 and 3, respectively over the time axis (all respectively in arbitrary units).

The first gradient (in the z-direction) is applied at the excitation and ensures that only a single slice of the body has the matching Larmor frequency, thus only the spins of the desired volume (slab) are deflected (slice selection gradient).

The second gradient (in the x-direction) is switched at right angles to the other two during the measurement and ensures that the spins of each image column have a different precession velocity, thus emit a different Larmor frequency (readout gradient, frequency coding gradient).

The third gradient (in the y-direction) transverse to the first is switched shortly after the excitation and produces a controlled dephasing of the spins such that the precession of the spins has a different phase position in each image line (phase coding gradient).

FIG. 2 shows that the first refocusing pulse 1.Ref is emitted after an echo time ESP (echo spacing) after the excitation pulse A, such that the first echo signal E1 that is thereby generated is generated after an additional echo time ESP (echo spacing) after the first refocusing pulse 1.Ref is read out by the first readout window ADC1 of the A/D converter.

The remaining subsequent refocusing pulses Ref are then output at periodically constant time intervals after the first echo signal E1.

The second refocusing pulse 2.Ref following the first refocusing pulse 1.Ref is then emitted in a time interval ESP2 after the first echo signal E1, wherein the second echo signal E2 that is thereby generated is generated at the same time interval ESP2 after the second refocusing pulse 2.Ref and is read out by the second readout window of the A/D converter ADC2.

The third refocusing pulse 3.Ref following the second refocusing pulse 2.Ref is then emitted in a time interval ESP2 after the second echo signal E2, wherein the third echo signal E3 that is thereby generated is generated at the same time interval ESP2 after the third refocusing pulse 3.Ref and is read out by the third readout window of the A/D converter ADC3.

The further echo signals En are then formed analogous to the first three echo signals E1, E2, E3. It is apparent that the echo time ESP (echo spacing) before and after the first refocusing pulse 1.Ref is preferably greater than the subsequent echo times ESP2 before and after the respective subsequent additional refocusing pulses 2.Ref, 3.Ref, . . . , n.Ref.

During the acquisition of the echoes E1, E2, E3, . . . , En or, respectively, during the placement of the readout window, a gradient grad-x is respectively switched in the readout direction (here the x-direction) for spatial coding.

A prephaser gradient pre-grad-x that provides for a matching prephasing of the spins is switched before the first gradient grad-x for spatial coding.

The gradient pulse SPX in the x-direction that lies even further beforehand is an optional spoiler.

The additional gradient pulses on the y-axis and z-axis that are not individually mentioned serve for phase coding.

As is apparent in FIG. 3, at the end of the sequence, after the last refocusing pulse Ref-last an RF restore pulse Res is output that ensures that the remaining transversal magnetization is flipped back again out of the transversals, and that the sequence could immediately be repeated afterwards. A number of such echo trains are typically executed in a sequence. Here a rephaser gradient re-grad-x is placed between the last refocusing pulse Ref-last and the RF restore pulse Res, which rephaser gradient re-grad-x provides for a resetting of the magnetization into the longitudinal plane of the spins so that the subsequent echo train is also inasmuch unaffected by the preceding echo train. The time interval between the last refocusing pulse Ref-last and the RF restore pulse Res should thereby amount to the echo spacing ESP2. A spoiler can again optionally following afterwards. At this point, it is to be noted that the time intervals of pulses or, respectively, echoes and readout windows are respectively always defined center-center of the appertaining pulse etc.

The prephaser gradient pre-grad-x and/or rephaser gradient re-grad-x or, respectively, their time position that are described above are influenced as explained in the following using FIGS. 4 through 7 in order to minimize as much as possible the effects of the eddy currents that are thereby caused on the imaging.

Figure 4:
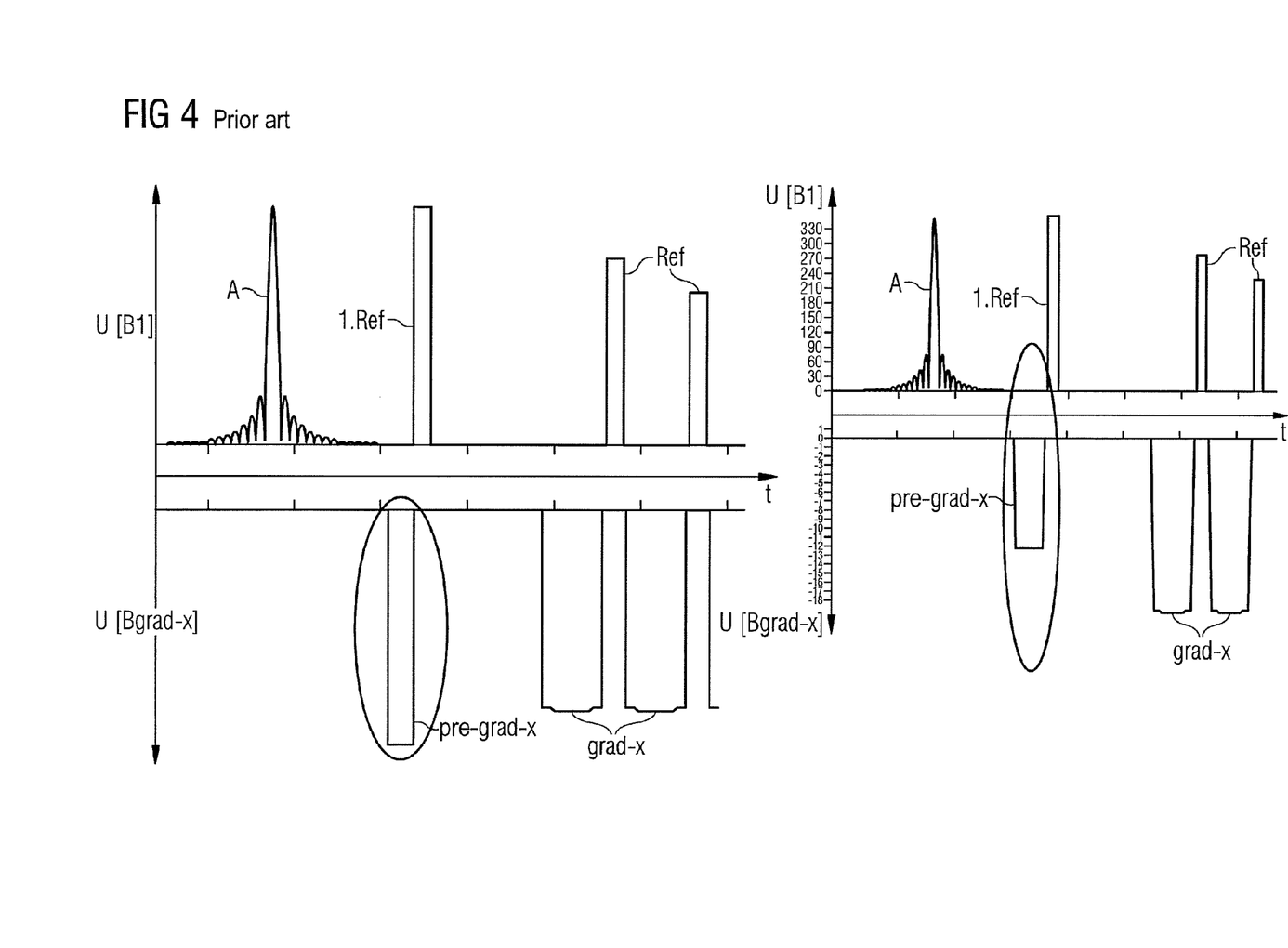
FIG. 4 is a diagram of a section of a pulse sequence according to the prior art (left) and a first embodiment of the invention (right) in comparison, in which the prephaser gradient pulse has lower slew rates than the number of readout gradient pulses.

FIG. 4 shows a pulse diagram of the first pulses of an echo train of a pulse sequence according to the prior art (left) and a first embodiment of the invention (right) in comparison, which pulse diagram is reduced to two axes (RF and x-gradient). The voltage U(B1) of the B1 RF field and of the gradient field Bgrad are hereby respectively plotted in the x-direction over the time axis t.

The comparison of the two sub-diagrams according to the prior art (left in FIG. 4) and according to the invention (right in FIG. 4) shows that, in the invention, the prephaser gradient pulse pre-grad-x has lower slew rates than the number of subsequent readout gradient pulses grad-x. The prephaser gradient pulse pre-grad-x hereby lies chronologically before the first RF refocusing pulse 1.Ref in the second gradient direction x, following which are additional refocusing pulses.

The reason for this special readout prephaser gradient (prephaser) with lower slew rates is the following:

The readout prephaser gradient (prephaser) pre-grad-x before the first refocusing pulse 1.Ref is output very quickly in the prior art, with maximum slew rate and maximum amplitude (voltage). This causes unwanted eddy currents which spread or, respectively, widen the frequency distribution even more. Due to B1 limits, the limited bandwidth of the 1st refocusing pulse 1.Ref is not sufficient in order to cover the frequency range due to eddy currents, in particular for adipose tissue with additional chemical shift.

Therefore, the prephaser pre-grad-x according to the invention is explicitly designed with lower slew rates. In this example, the prephaser pre-grad-x is also output with lower amplitude U(B1), wherein the gradient moment—thus the area that the prephaser pre-grad-x encloses with the time axis t—should preferably remain the same in comparison to the prior art.

Figure 5:
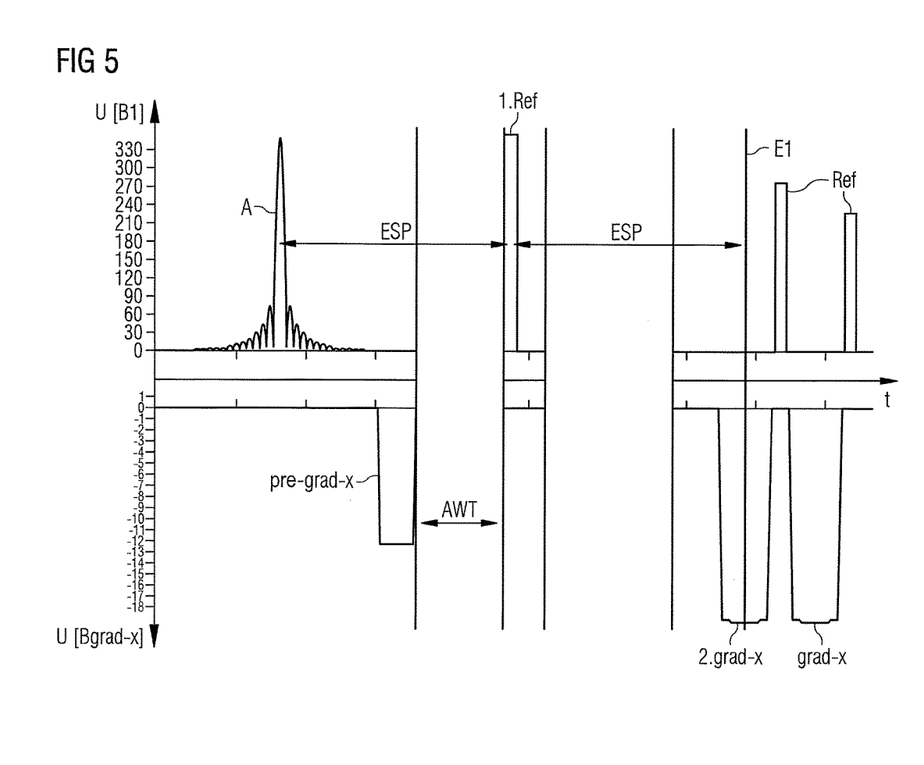
FIG. 5 is a diagram of a section of a pulse sequence of a second embodiment of the invention, in which a wait time interval is inserted between the prephaser gradient pulse and the first refocusing pulse.

FIG. 5 shows a pulse diagram of the first pulses of an echo train of a pulse sequence of a second embodiment of the invention, which pulse diagram is likewise reduced to two axes (RF and x-gradient). The voltage U(B1) of the B1 RF field and of the gradient field Bgrad in the x-direction are hereby respectively plotted over the time axis t.

According to the invention, a wait time interval AWT is inserted between the prephaser gradient pulse pre-grad-x and the first refocusing pulse 1.Ref in order to further reduce the influence of the eddy current effects on the or, respectively, at the point in time of the subsequent RF pulse.

The time ESP (echo spacing) is the time between the excitation pulse A and the first refocusing pulse 1.Ref, which is equal to the time between the first refocusing pulse 1.Ref and the second readout gradient pulse 2.grad-x.

Figure 6:
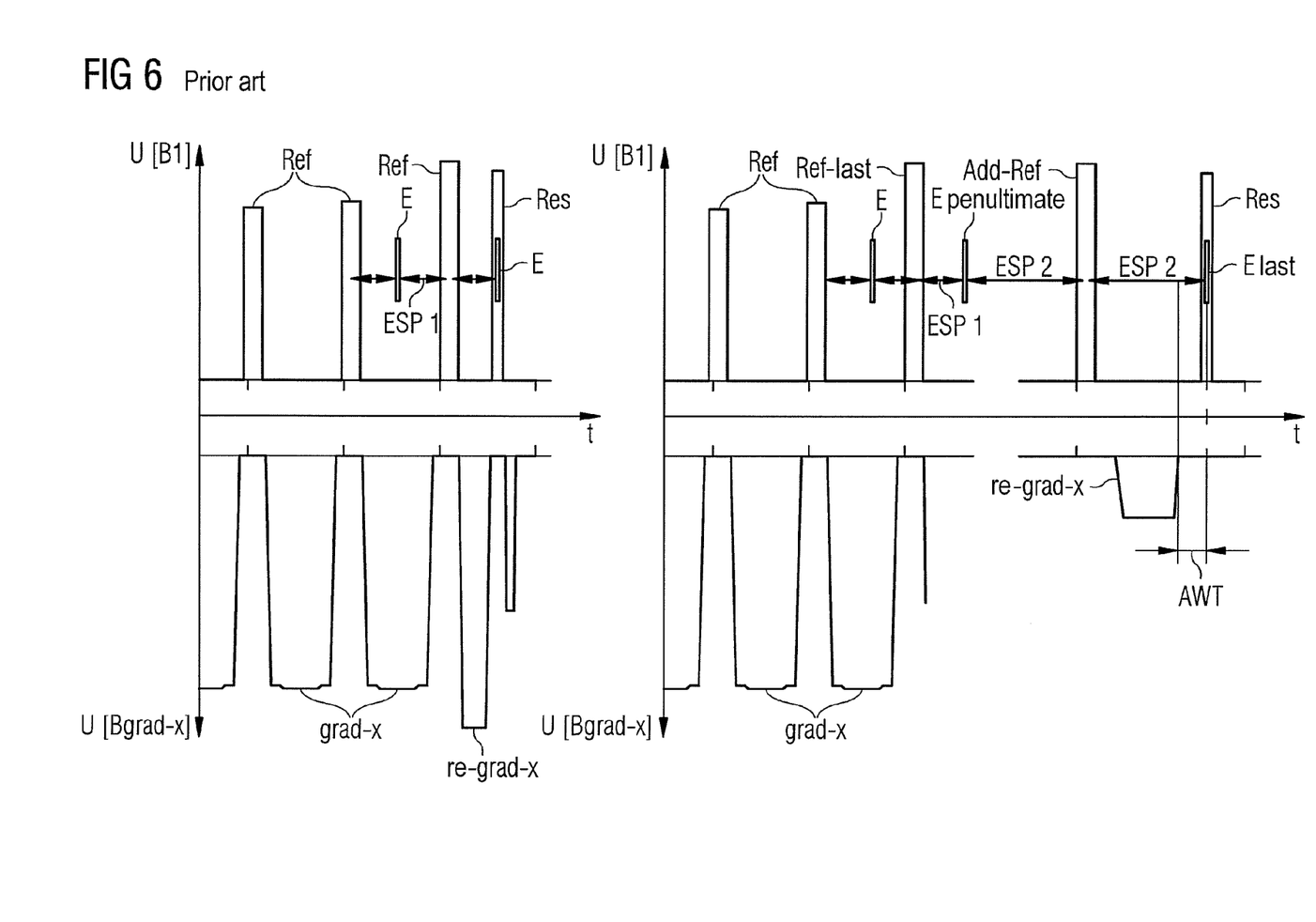
FIG. 6 is a diagram of a section of a pulse sequence according to the prior art (left) and a third embodiment of the invention (right) in comparison, in which the rephaser gradient pulse has lower slew rates than the number of readout gradient pulses, and in which an additional refocusing pulse Add-Ref is inserted between the last refocusing pulse and the RF restore pulse, and in which a wait time interval is inserted between the rephaser gradient pulse and the RF restore pulse.

FIG. 6 shows a pulse diagram of the last pulse of an echo train of a pulse sequence according to the prior art (left) and of a third embodiment of the invention (right) in comparison, which pulse diagram is again reduced to two axes (RF and x-gradient). The voltage U(B1) of the B1 RF field and of the gradient field Bgrad in the x-direction are hereby respectively plotted over the time axis t.

The comparison of the two sub-diagrams according to the prior art (left in FIG. 6) and according to the invention (right in FIG. 6) shows that, in the invention, the rephaser gradient pulse re-grad-x has lower slew rates than the number of readout gradient pulses grad-x.

Moreover, the echo signals between the refocusing pulses Ref are shown with the reference character E, wherein the echo signals E temporally coincide with the readout gradient pulses grad-x and the last echo signal E-last temporally coincides with the restore pulse Res, wherein the last echo signal E-last is no longer read out.

Here, the same reasons as stated above for the prephaser gradient pulse pre-grad-x apply to the rephaser gradient pulse re-grad-x. In the prior art, the rephasing gradient (rephaser) re-grad-x is also output very quickly with maximum slew rate and maximum amplitude, wherein the eddy currents that are caused widen the frequency distribution even more.

The time ESP1 (echo spacing 1) is the time between an echo signal and the adjacent refocusing pulse Ref.

The time ESP2 (echo spacing 2) is the time between the penultimate echo signal E-penultimate and the additionally inserted refocusing pulse Add-Ref which—identical to the time ESP2 (echo spacing 2—lies between the additionally inserted refocusing pulse Add-Ref and the last echo signal E-last.

In comparison to the time ESP1 (echo spacing 1), the time ESP2 (echo spacing 2) is extended by one pulse.

In the embodiment of FIG. 6, an optional wait time interval AWT is also present (similar to that of the embodiment in FIG. 5), wherein the AWT in FIG. 6 is, however, situated between the rephaser gradient pulse re-grad-x and the restore pulse Res.

Furthermore, FIG. 6 shows that an additional refocusing pulse Add-Ref is inserted between the last refocusing pulse Ref-last and the RF restore pulse.

Figure 7:
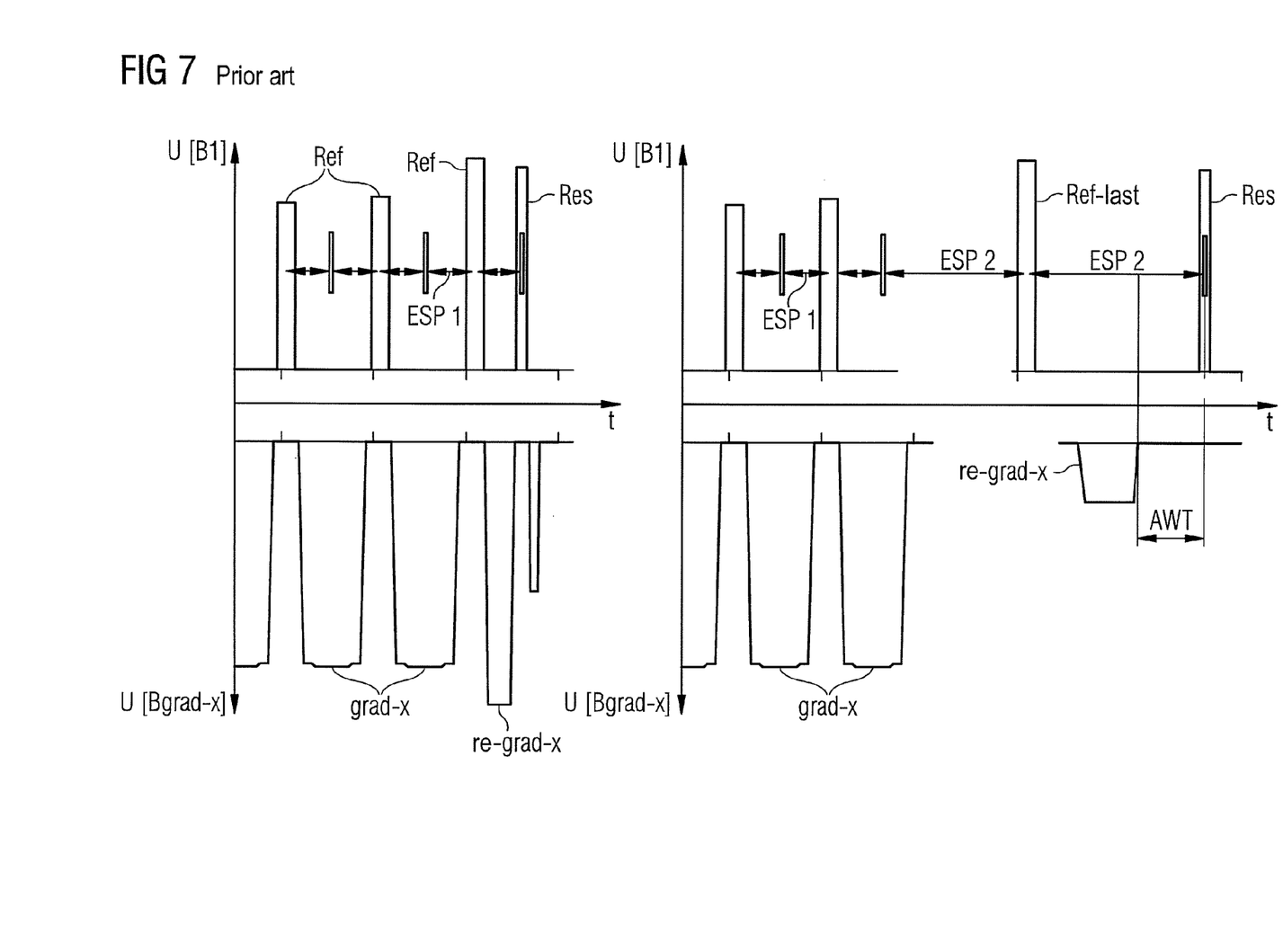
FIG. 7 is a diagram of a section of a pulse sequence of a fourth embodiment of the invention, similar to the embodiment of FIG. 6, but instead of the additional refocusing pulse Add-Ref the last refocusing pulse Ref-last is output chronologically later.

Finally, FIG. 7 shows a pulse diagram of the last pulse of an echo train of a pulse sequence of a fourth embodiment of the invention (similar to the embodiment of FIG. 6), which pulse diagram is reduced to two axes (RF and x-gradient); however, instead of the additional refocusing pulse Add-Ref, the last refocusing pulse Ref-last is output chronologically later, after an extended echo spacing ESP2.

Furthermore, FIG. 7 shows that a wait time interval AWT is inserted between the rephaser gradient pulse re-grad-x and the RF restore pulse Res, similar or identical to the wait time interval AWT of the embodiments of FIGS. 5 and 6.

In the embodiments of FIGS. 6 and 7, the execution (slew rate, amplitude, width in time axis direction) of the gradient re-grad-x before the restore pulse Res is reduced, and a time delay AWT is inserted between the restore pulse Res and the gradient re-grad-x.

In order for the time curve of the echo train not to be affected, an extended echo train delay ESP2 is inserted. The additional refocusing pulse Add-Ref generates an echo with a longer time gap ESP2 before the restore pulse Res. Due to the extended ESP2, a gradient re-grad-x with reduced execution can be used in order to reduce eddy current artifacts.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to operate a magnetic resonance system, comprising:

from a control computer, operating a magnetic resonance data acquisition unit, comprising a radio-frequency (RF) system and a gradient system, according to a pulse sequence comprising an excitation phase and an acquisition phase;

from said control computer, in said excitation phase, operating said RF system to emit an RF excitation pulse that excites nuclear spins in an examination volume of a subject situated in the data acquisition unit;

from said control computer, in said acquisition phase, operating said RF system to emit a plurality of RF refocusing pulses and operating said gradient system to activate a plurality of readout gradient pulses in a gradient direction, that spatially codes, along said gradient direction, raw data acquired by said RF system that are produced by said nuclear spins in said examination volume after excitation thereof;

from said control computer, in said acquisition phase, operating said RF system and said gradient system to perform at least one of (a) activate a prephasing gradient pulse in said gradient direction before an RF refocusing pulse and (b) emit an RF restore pulse following said plurality of RF refocusing pulses, and activate a rephaser gradient pulse in said gradient direction before said RF restore pulse; and from said control computer, performing at least one of (a) and (b) by at least one of (c) activating at least one of said prephaser gradient pulse and said rephaser gradient pulse with a lower slew rate than said plurality of gradient pulses, and (d) inserting a wait time interval between at least one of a time between said prephaser gradient pulse and said refocusing pulse, and a time between said rephaser gradient pulse and said RF restore pulse.

2. A method as claimed in claim 1 comprising, from said computer in said excitation phase, operating said gradient system to activate a selection gradient pulse in a first gradient direction that makes said RF excitation pulse spatially selective, and wherein said gradient direction in which said readout gradient pulses, and said prephasing gradient pulse and said rephasing gradient pulse, are activated is a second gradient direction perpendicular to said first gradient direction.

3. A method as claimed in claim 1 comprising emitting said RF refocusing pulse in (a) associated with a first readout procedure among said plurality of readout gradient pulses.

4. A method as claimed in claim 1 wherein each of said plurality of readout gradient pulses and said rephaser gradient pulse, in addition to said slew rate, has a pulse amplitude and a pulse duration, and comprising activating said rephaser gradient pulse, at at least one of a beginning or an end of said rephaser pulse, with a flatter slew rate than the slew rate of a majority of said plurality of readout gradient pulses and/or with a lower pulse amplitude than the pulse amplitude of a majority of said readout gradient pulses, and/or with a longer pulse duration than a majority of said readout gradient pulses.

5. A method as claimed in claim 4 wherein said pulse amplitude and said pulse duration of each of said readout gradient pulses and said rephaser gradient pulse give each of said readout gradient pulses and said rephaser gradient pulse a gradient moment, and comprising activating said rephaser gradient pulse with substantially the same gradient moment as the gradient moment of a majority of said readout gradient pulses.

6. A method as claimed in claim 4 comprising activating at least one of said prephaser gradient pulse and said rephaser gradient pulse with a slew rate of 20 mT/(m·ms).

7. A method as claimed in claim 4 comprising activating at least one of said prephaser gradient pulse and said rephaser gradient pulse with a slew rate that is less than or equal to 120 mT/(m·ms).

8. A method as claimed in claim 4 comprising activating at least one of said prephaser gradient pulse and said rephaser gradient pulse with a slew rate that is less than or equal to 100 mT/(m·ms).

9. A method as claimed in claim 4 comprising activating at least one of said prephaser gradient pulse and said rephaser gradient pulse with a slew rate that is less than or equal to 80 mT/(m·ms).

10. A method as claimed in claim 1 wherein said at least one wait time interval has a duration in a range between greater than or equal to 1 ms and less than or equal to 20 ms.

11. A method as claimed in claim 1 comprising, from said control computer, operating said RF system to perform at least one of (e) emit an additional RF refocusing pulse before said RF restore pulse and (f) emit a last RF refocusing pulse of a readout sequence chronologically later by one pulse period.

12. A control device for operating a magnetic resonance system, said magnetic resonance system comprising an RF system and a gradient system, said control device being configured to:
operate said magnetic resonance system according to a pulse sequence comprising an excitation phase and an acquisition phase;
in said excitation phase, operate said RF system to emit an RF excitation pulse that excites nuclear spins in an examination volume of a subject situated in the data acquisition unit;
in said acquisition phase, operate said RF system to emit a plurality of RF refocusing pulses and operate said gradient system to activate a plurality of readout gradient pulses in a gradient direction, that spatially codes, along said gradient direction, raw data acquired by said RF system that are produced by said nuclear spins in said examination volume after excitation thereof;
in said acquisition phase, operate said RF system and said gradient system, to perform at least one of (a) activate a prephasing gradient pulse in said gradient direction before an RF refocusing pulse and (b) emit an RF restore pulse following said plurality of RF refocusing pulses, and activate a rephaser gradient pulse in said gradient direction before said RF restore pulse; and
perform at least one of (a) and (b) by at least one of (c) activating at least one of said prephaser gradient pulse and said rephaser gradient pulse with a lower slew rate than said plurality of gradient pulses, and (d) inserting a wait time interval between at least one of a time between said prephaser gradient pulse and said refocusing pulse, and a time between said rephaser gradient pulse and said RF restore pulse.

13. A magnetic resonance apparatus comprising:
a magnetic resonance data acquisition unit, comprising a radio-frequency (RF) system and a gradient system;
a control computer configured to operate the magnetic resonance data acquisition unit according to a pulse sequence comprising an excitation phase and an acquisition phase;
said control computer, in said excitation phase, being configured to operate said RF system to emit an RF excitation pulse that excites nuclear spins in an examination volume of a subject situated in the data acquisition unit;
said control computer, in said acquisition phase, being configured to operate said RF system to emit a plurality of RF refocusing pulses and to operate said gradient system to activate a plurality of readout gradient pulses in a gradient direction, that spatially codes, along said gradient direction, raw data acquired by said RF system that are produced by said nuclear spins in said examination volume after excitation thereof;
said control computer, in said acquisition phase, being configured to operate said RF system and said gradient system to perform at least one of (a) activate a prephasing gradient pulse in said gradient direction before an RF refocusing pulse and (b) emit an RF restore pulse following said plurality of RF refocusing pulses, and activate a rephaser gradient pulse in said gradient direction before said RF restore pulse; and
said control computer being configured to perform at least one of (a) and (b) by at least one of (c) activating at least one of said prephaser gradient pulse and said rephaser gradient pulse with a lower slew rate than said plurality of gradient pulses, and (d) inserting a wait time interval between at least one of a time between said prephaser gradient pulse and said refocusing pulse, and a time between said rephaser gradient pulse and said RF restore pulse.

14. A non-transitory, computer-readable data storage medium encoded with programming instructions, said storage medium being loaded into a control computer of a magnetic resonance apparatus, which comprises an RF system and a gradient system, and said programming instructions causing said control computer to:
operate a magnetic resonance apparatus, according to a pulse sequence comprising an excitation phase and an acquisition phase;
in said excitation phase, operate said RF system to emit an RF excitation pulse that excites nuclear spins in an examination volume of a subject situated in the data acquisition unit;
in said acquisition phase, operate said RF system to emit a plurality of RF refocusing pulses and operate said gradient system to activate a plurality of readout gradient pulses in a gradient direction, that spatially codes, along said gradient direction, raw data acquired by said RF system that are produced by said nuclear spins in said examination volume after excitation thereof;

in said acquisition phase, operate said RF system and said gradient system to perform at least one of (a) activate a prephasing gradient pulse in said gradient direction before an RF refocusing pulse and (b) emit an RF restore pulse following said plurality of RF refocusing pulses, and activate a rephaser gradient pulse in said gradient direction before said RF restore pulse; and perform at least one of (a) and (b) by at least one of (c) activating at least one of said prephaser gradient pulse and said rephaser gradient pulse with a lower slew rate than said plurality of gradient pulses, and (d) inserting a wait time interval between at least one of a time between said prephaser gradient pulse and said refocusing pulse, and a time between said rephaser gradient pulse and said RF restore pulse.

* * * * *